(12) United States Patent
Bruland et al.

(10) Patent No.: US 8,076,605 B2
(45) Date of Patent: Dec. 13, 2011

(54) SYSTEMS AND METHODS FOR ADAPTING PARAMETERS TO INCREASE THROUGHPUT DURING LASER-BASED WAFER PROCESSING

(75) Inventors: Kelly J. Bruland, Portland, OR (US); Clint Vandergiessen, Beaverton, OR (US); Duane Eitzen, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 697 days.

(21) Appl. No.: 11/768,048

(22) Filed: Jun. 25, 2007

(65) Prior Publication Data

US 2008/0314879 A1    Dec. 25, 2008

(51) Int. Cl.
*B23K 26/04* (2006.01)
(52) U.S. Cl. .................................. 219/121.62
(58) Field of Classification Search ............ 219/121.69, 219/121.72, 121.85, 121.68, 121.67; 438/129, 438/130
See application file for complete search history.

(56) References Cited

U.S. PATENT DOCUMENTS

| | | | |
|---|---|---|---|
| 4,157,923 A * | 6/1979 | Yen et al. | 148/512 |
| 4,678,889 A * | 7/1987 | Yamanaka | 219/121.69 |
| 5,166,492 A * | 11/1992 | Rivera | 219/121.68 |
| 5,444,640 A * | 8/1995 | Hirai | 700/193 |
| 5,568,408 A * | 10/1996 | Maeda | 702/117 |
| 5,595,583 A | 1/1997 | Murnick | |
| 5,837,962 A | 11/1998 | Overbeck | |
| 5,936,764 A | 8/1999 | Kobayashi | |
| 5,939,704 A | 8/1999 | Perrie et al. | |
| 5,969,851 A | 10/1999 | Clark et al. | |
| 6,031,852 A | 2/2000 | Thompson et al. | |
| 6,144,118 A | 11/2000 | Cahill et al. | |
| 6,495,791 B2 | 12/2002 | Hunter et al. | |
| 6,662,063 B2 | 12/2003 | Hunter et al. | |
| 6,744,228 B1 | 6/2004 | Cahill et al. | |
| 6,751,009 B2 | 6/2004 | Khoshnevisan et al. | |
| 6,816,294 B2 | 11/2004 | Unrath et al. | |
| 6,949,844 B2 | 9/2005 | Cahill et al. | |
| 6,972,268 B2 | 12/2005 | Ehrmann et al. | |
| 7,019,891 B2 | 3/2006 | Johnson | |
| 7,027,199 B2 | 4/2006 | Johnson | |
| 7,197,208 B2 | 3/2007 | Trutna, Jr. et al. | |

(Continued)

OTHER PUBLICATIONS

I.C. Chang, "Acoustooptic Devices and Applications," IEEE Trans. Sonics and Ultrason., vol. SU-23, Jan. 1976, pp. 2-22.

(Continued)

*Primary Examiner* — Tu B Hoang
*Assistant Examiner* — Thien Tran
(74) *Attorney, Agent, or Firm* — Stoel Rives LLP

(57) ABSTRACT

Systems and methods automatically modify a laser-based system for processing target specimens such as semiconductor wafers. In one embodiment, the laser-based system detects a trigger associated with a processing model. The processing model corresponds to a set of wafers. In response to the trigger, the system automatically adjusts one or more system parameters based on the processing model. The system then uses the modified system parameters to selectively irradiate structures on or within at least one wafer in the set of wafers. In one embodiment, the trigger includes variations in a thermal state related to a motion stage. In response to the variations in the thermal state, the system operates the motion stage in a series of movements until a thermal equilibrium threshold is reached. The sequence of movements may, for example, simulate movements used to process a particular wafer.

9 Claims, 6 Drawing Sheets

U.S. PATENT DOCUMENTS

| | | | |
|---|---|---|---|
| 2001/0052512 A1* | 12/2001 | Hunter et al. | 219/121.6 |
| 2002/0117481 A1 | 8/2002 | Unrath et al. | |
| 2002/0162973 A1 | 11/2002 | Cordingley et al. | |
| 2002/0167581 A1 | 11/2002 | Cordingley et al. | |
| 2005/0254109 A1 | 11/2005 | Bruland et al. | |
| 2005/0270629 A1 | 12/2005 | Johnson | |
| 2005/0270630 A1 | 12/2005 | Johnson | |
| 2005/0270631 A1 | 12/2005 | Johnson | |
| 2005/0279807 A1 | 12/2005 | Johnson | |
| 2005/0279808 A1 | 12/2005 | Johnson | |
| 2005/0281102 A1 | 12/2005 | Bruland | |
| 2005/0282319 A1 | 12/2005 | Bruland et al. | |
| 2005/0282407 A1 | 12/2005 | Bruland et al. | |
| 2006/0028655 A1 | 2/2006 | Cordingley et al. | |
| 2006/0028710 A1 | 2/2006 | Johnson et al. | |
| 2006/0055504 A1* | 3/2006 | Pailthorp et al. | 338/195 |
| 2006/0086702 A1 | 4/2006 | Smart | |
| 2006/0151704 A1 | 7/2006 | Cordingley | |
| 2006/0191884 A1* | 8/2006 | Johnson et al. | 219/121.85 |
| 2006/0192845 A1 | 8/2006 | Cordingley et al. | |
| 2006/0207975 A1 | 9/2006 | Ehrmann et al. | |
| 2007/0020785 A1 | 1/2007 | Bruland et al. | |
| 2007/0075063 A1* | 4/2007 | Wilbanks et al. | 219/121.85 |
| 2007/0106416 A1* | 5/2007 | Griffiths et al. | 700/166 |
| 2007/0173075 A1* | 7/2007 | Lee et al. | 438/795 |

OTHER PUBLICATIONS

Saleh, B.E.A. and Teich, M.C., "Fundamentals of Photonics," John Wiley & Sons, Inc., New York, 1991, pp. 818-820.

NTT News Release, "Discovery of a Novel Beam Scanning Phenomenon—High-Speed, Compact Optical Beam Scanner is realized with KTN Crystal," available at <<http://www.ntt.co.jp/news/news06e/0605/060518.html>>, last accessed May 11, 2007.

May 26, 2008, International Search Report and Written Opinion for PCT/US2007/085870, international filed Nov. 29, 2007.

* cited by examiner

SYSTEMS AND METHODS FOR ADAPTING PARAMETERS TO INCREASE THROUGHPUT DURING LASER-BASED WAFER PROCESSING

TECHNICAL FIELD

This disclosure relates generally to manufacturing semiconductor integrated circuits. In particular, this disclosure relates to the use of laser beams to process structures on or within a semiconductor integrated circuit.

BACKGROUND INFORMATION

Laser-based semiconductor processing systems are generally used, for example, to drill, machine, trim, sever, scribe, mark, cleave, make, heat, alter, diffuse, anneal, and/or measure a structure or its material on or within a semiconductor substrate. To improve throughput during fabrication of integrated circuits (ICs), it is also generally desirable that laser-based processing systems accurately and quickly process selected structures on or within the semiconductor substrate. However, conventional laser-based processing systems are typically tuned and operated with a conservative set of parameters to provide good accuracy for all types of ICs intended to be processed by the system. This "one-size-fits-all" approach often results in reduced processing speeds and overall reduced throughput.

A semiconductor link processing system, for example, typically provides the same level of accuracy when severing links on any IC. During fabrication, ICs often incur defects for various reasons. For that reason, IC devices are usually designed to include redundant circuit elements, such as spare rows and columns of memory cells in semiconductor memory devices, e.g., a DRAM (dynamic random access memory), an SRAM (static random access memory), or an embedded memory. Such devices are also designed to include particular laser-severable links between electrical contacts of the redundant circuit elements. Such links can be removed, for example, to disconnect a defective memory cell and to substitute a replacement redundant cell. Links may also be removed for identification, configuration and voltage adjustment. Similar techniques are also used to sever links in order to program or configure logic products, such as gate arrays or ASICs (application-specific integrated circuits). After an IC has been fabricated, its circuit elements are tested for defects, and the locations of defects may be recorded in a database. Combined with positional information regarding the layout of the IC and the location of its circuit elements, a laser-based link processing system can be employed to remove selected links so as to make the IC useful.

Laser-severable links are typically about 0.5-1 microns (μm) thick, about 0.5-1 μm wide, and about 8 μm in length. Circuit elements in an IC, and thus links between those elements, are typically arranged in a regular geometric arrangement, such as in regular rows. In a typical row of links, the center-to-center pitch between adjacent links is about 2-3 μm. These dimensions are representative, and are declining as technological advances allow for the fabrication of workpieces with smaller features and the creation of laser processing systems with greater accuracy and smaller focused laser beam spots. Although the most prevalent link materials have been polysilicon and like compositions, memory manufacturers have more recently adopted a variety of more electrically conductive metallic link materials that may include, but are not limited to, aluminum, copper, gold nickel, titanium, tungsten, platinum, as well as other metals, metal alloys, metal nitrides such as titanium or tantalum nitride, metal silicides such as tungsten silicide, or other metal-like materials.

Conventional laser-based semiconductor link processing systems focus a single pulse of laser output having a pulse width of about 4 to 30 nanoseconds (ns) at each link. The laser beam is incident upon the IC with a footprint or spot size large enough to remove one and only one link at a time. When a laser pulse impinges a polysilicon or metal link positioned above a silicon substrate and between component layers of a passivation layer stack including an overlying passivation layer, which is typically 2000-10,000 angstroms (Å) thick, and an underlying passivation layer, the silicon substrate absorbs a relatively small proportional quantity of infrared (IR) radiation and the passivation layers (silicon dioxide or silicon nitride) are relatively transparent to IR radiation. IR and visible laser wavelengths (e.g., 0.532 μm, 1.047 μm, 1.064 μm, 1.321 μm, and 1.34 μm) have been employed for more than 20 years to remove circuit links.

Many conventional semiconductor link processing systems employ a single laser pulse focused into a small spot for link removal. Banks of links to be removed are typically arranged on the wafer in a straight row, an illustrative one of which is shown in FIG. 1. The row need not be perfectly straight, although typically it is quite straight. The links are processed by the system in a link run 120, which is also referred to as an on-the-fly ("OTF") run. During a link run, the laser beam is pulsed as a stage positioner passes the row of links across the location of the focused laser spot 110. The stage typically moves along a single axis at a time and does not stop at each link position. Thus, the link run is a processing pass down a row of links in a generally lengthwise direction (e.g., horizontally across the page as shown). Moreover, the lengthwise direction of the link run 120 need not be exactly perpendicular to the lengthwise direction of the individual links that constitute the row, although that is typically true.

Impingent upon selected links in the link run 120 is a laser beam whose propagation path is along an axis. The position at which that axis intersects the workpiece continually advances along the link run 120 while pulsing the laser to selectively remove links. The laser is triggered to emit a pulse and sever a link when the wafer and optical components have a relative position such that the pulse energy impinges upon the link (e.g., trigger position 130). Some of the links are not irradiated and left as unprocessed links 140, while others are irradiated to become severed links 150.

FIG. 2 illustrates a typical link processing system that adjusts the position of the spot 110 by moving a wafer 240 in an XY plane underneath a stationary optics table 210. The optics table 210 supports a laser 220, a mirror 225, a focusing lens 230, and possibly other optical hardware. The wafer 240 is moved underneath in the XY plane by placing it on a chuck 250 that is carried by a motion stage 260.

FIG. 3 depicts the processing of the wafer 240. A conventional sequential link blowing process requires scanning the XY motion stage 260 across the wafer 240 once for each link run. Repeatedly scanning back and forth across the wafer 240 results in complete wafer processing. A machine typically scans back and forth processing all X-axis link runs 310 (shown with solid lines) before processing the Y-axis link runs 320 (shown in dashed lines). This example is merely illustrative. Other configurations of link runs and processing modalities are possible. For example, it is possible to process links by moving the wafer or optics rail. In addition, link banks and link runs may not be processed with continuous motion.

For a wafer 240 comprising DRAM, for example, memory cells (not shown) may be located in the areas 322 between the X-axis link runs 310 and the Y-axis link runs 320. For illustrative purposes, a portion of the wafer 240 near an intersection of an X-axis link run 310 and a Y-axis link run 320 is magnified to illustrate a plurality of links 324 arranged in groups or link banks. Generally, the link banks are near the center of a die, near decoder circuitry, and not above any of the array of memory cells. The links 324 cover a relatively small area of the total wafer 240.

System parameters that may impact the time spent executing link runs, and thus throughput, include the laser pulse repetition frequency (PRF) and motion stage parameters such as stage acceleration, bandwidth, settling time, and the commanded stage trajectory. The commanded stage trajectory includes acceleration and deceleration segments, constant velocity processing of link banks, and "gap profiling" or accelerating over large gaps between links to be processed in a link run.

These and other system parameters may change between semiconductor wafers, between different types of semiconductor wafers, and/or with time. However, conventional semiconductor link processing systems typically use predetermined hardware configurations and motion profiling parameters, regardless of the differences between semiconductor wafers and/or system characteristics that change with time. Thus, processing accuracy may exceed expected or desired levels at the cost of reduced throughput for some semiconductor wafers.

SUMMARY OF THE DISCLOSURE

The embodiments disclosed herein provide systems and methods for processing a plurality of structures, such as laser-severable links, on a semiconductor substrate. In one embodiment, a method detects a trigger associated with a processing model for a laser-based system. The processing model corresponds to a set of target specimens. The target specimens may include, for example semiconductor wafers. In response to the trigger, the method automatically adjusts one or more system parameters based on the processing model. The method also operates the laser-based system using the one or more adjusted system parameters to selectively irradiate structures on or within at least one target specimen in the set of target specimens.

In one embodiment, a system for processing target specimens includes a laser source configured to generate a laser beam. The system also includes a motion stage configured to position a target specimen with respect the laser source so as to selectively irradiate structures on or within the target specimen with the laser beam. During variations in a thermal state, the laser source is prevented from processing the structures while the motion stage performs a series of moves to adjust the thermal state to within a predetermined thermal equilibrium threshold. In one such embodiment, the laser source is deactivated while the laser source performs the series of moves. In other embodiments, the laser source is not deactivated such that energy from the laser source adds to the overall thermal state. For example, while the laser source is active, the motion stage according to one embodiment performs the series of moves to adjust the thermal state without a target specimen (workpiece) positioned on the chuck. As another example, the laser beam according to one embodiment is defocused so as to reduce or eliminate damage to the target specimen while the motion stage performs the series of moves to adjust the thermal state to within the predetermined thermal equilibrium threshold.

In one embodiment, a method for preheating a laser-based system for processing target specimens includes detecting variations in a thermal state. The method also includes simulating, in response to the variations, movement of a laser spot with respect to a plurality of structures on or within a target specimen.

In one embodiment, a laser processing system includes means for detecting variations in a thermal state, and means for simulating movement of a laser spot with respect to a plurality of structures on or within a target specimen. The simulated movement is in response to the detected variations in the thermal state.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
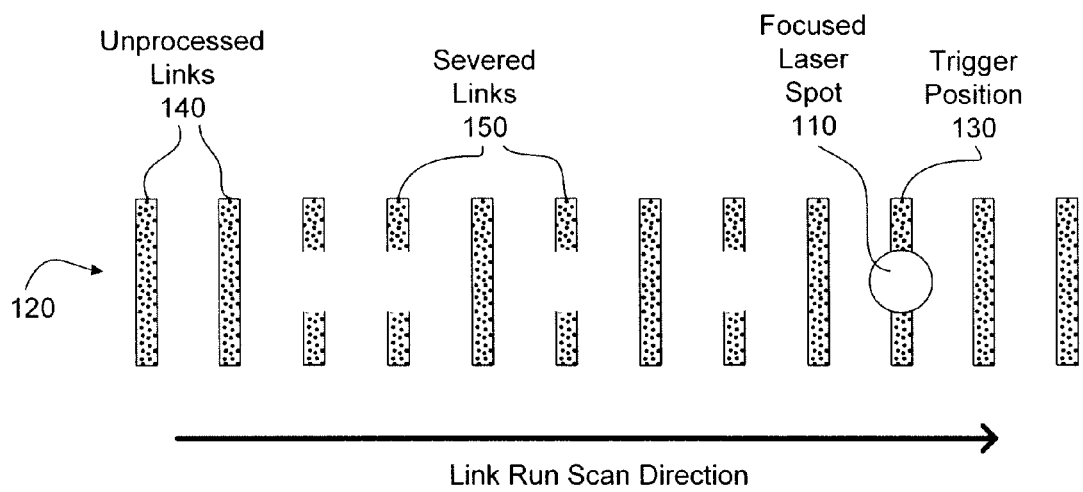
FIG. 1 is a schematic diagram illustrating a prior art row or bank of links being selectively irradiated with a laser spot scanning along a lengthwise direction of the bank.
Figure 2:
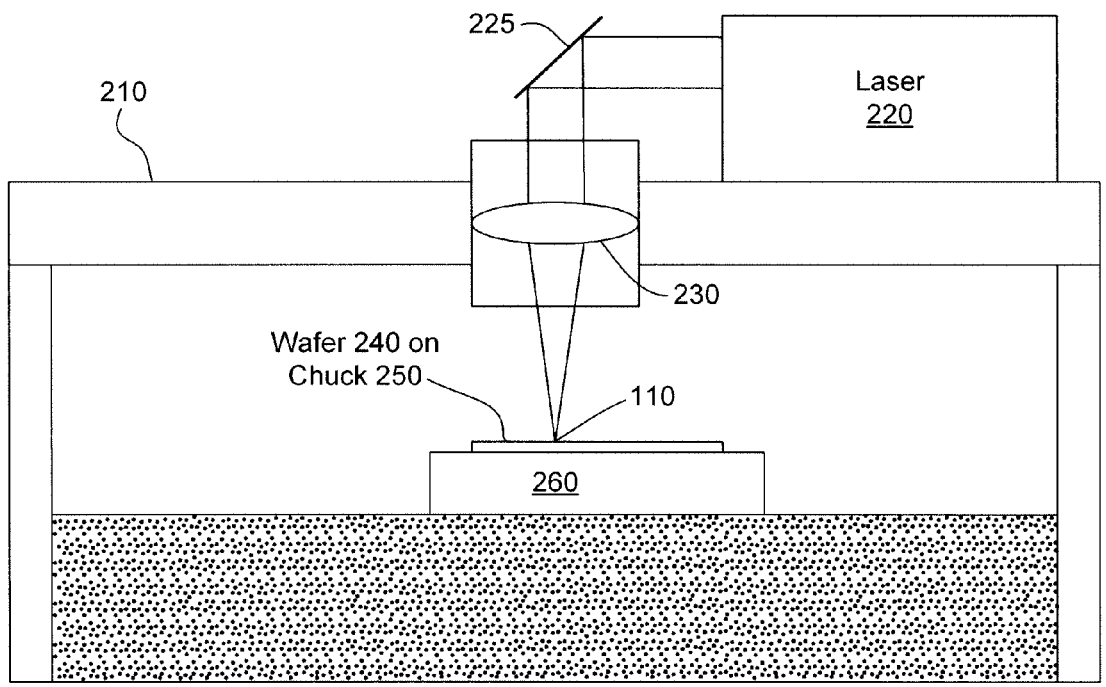
FIG. 2 is a schematic diagram of a prior art link processing system.
Figure 3:
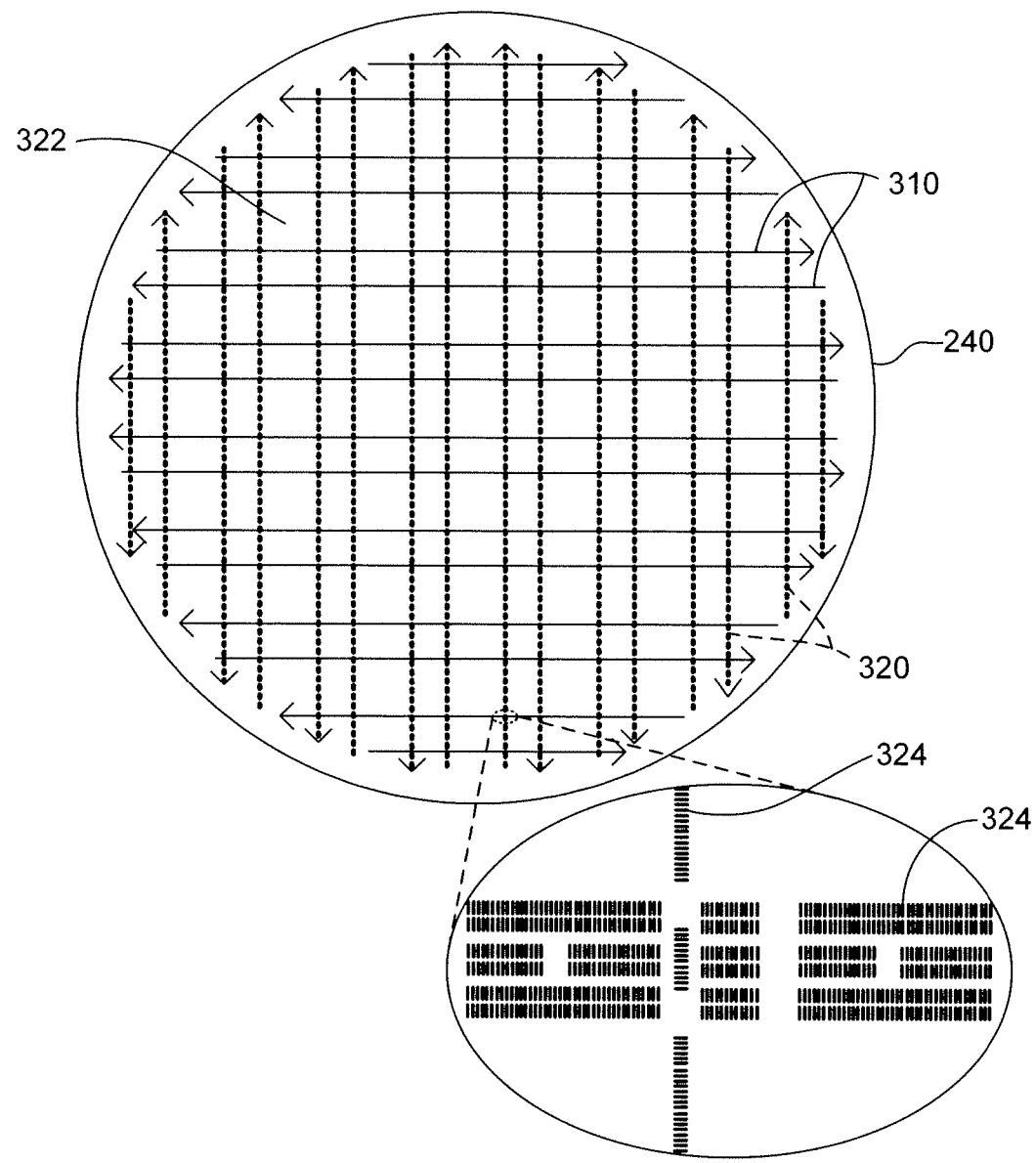
FIG. 3 is a schematic diagram of a prior art semiconductor wafer including a plurality of link runs.

With reference to the above-listed drawings, this section describes particular embodiments and their detailed construction and operation. The principles, methods, and systems disclosed below have general applicability for processing any structure on or within a semiconductor substrate using laser radiation for any purpose. While the examples and embodiments that follow are described in the context in which those structures are laser-severable links on or within an IC (e.g., memory device, logic device, optical or optoelectronic device including LEDs, and microwave or RF devices), other structures besides laser-severable links can be processed in the same or similar manner. Thus, the teachings set forth herein are equally applicable to the laser processing of other types of structures, such as electrical structures that become conductive as a result of laser radiation, other electrical structures, optical or electro-optical structures, and mechanical or electro-mechanical structures (e.g., MEMS (micro electromechanical structures) or MOEMS (micro opto-electro-mechanical structures)).

The purpose of the irradiation may be to sever, cleave, make, heat, alter, diffuse, anneal, or measure a structure or its material. For example, laser radiation can induce a state change in a structure's material, cause the migration of dopants, or alter magnetic properties—any of which could be used to connect, disconnect, tune, modify, or repair electrical circuitry or other structures.

Generally, the same level of accuracy is not required for all wafers processed on a link processing system. Further, conventional link processing systems typically do not allow users to optimize a tradeoff between the system's accuracy and throughput. In one embodiment disclosed herein, however, a user is allowed to select parameters in, for example, a link processing recipe file to optimize or improve throughput for a desired accuracy. Allowing recipe configurable system parameters allows for higher throughput with a lower, yet acceptable, accuracy when processing some wafers. When demanded or desired, the link processing system may provide a comparatively higher accuracy to other wafers using a slightly reduced throughput.

In addition, or in another embodiment, the link processing system may automatically select system parameters based on a processing model corresponding to the link processing system and a particular set of wafers. The processing model may be configured to dynamically optimize or improve throughput for a desired accuracy. Thus, for example, the link processing system may automatically update system parameters when processing wafers with different accuracy requirements or to compensate for time varying parameters. The parameters may vary, for example, due to transient conditions within the link processing system such as when the system is warming up. The parameters may also vary, for example, due to transient external conditions such as changes in ambient temperature or vibrations.

According to certain embodiments, users and/or link processing systems may select conservative processing parameters that cause the system to process wafers relatively slowly in order to satisfy a more stringent efficiency specification. The users and/or link processing systems may also select conservative processing parameters when, for example, the system may be in a less-accurate state (e.g., while the system is warming up). Thus, the users and/or link processing systems may selectively use an appropriate balance between throughput and accuracy when processing different wafers.

In addition, or in other embodiments, the users and/or link processing systems may select different processing parameters and system configuration parameters to achieve a desired accuracy (with reduced throughput) when system conditions and/or fabrication environment conditions require more conservative wafer setups. The more conservative setups may be based upon present and past conditions and/or the particular wafers to be processed. When conditions change (e.g., an equilibrium is reached), the user and/or link processing systems may then select parameters that produce improved throughput.

In one embodiment, the link processing system automatically enhances system accuracy without any mechanical changes using motion preheating. For example, during a warm up period, after a period of time with no activity, and/or when switching from a first type of wafer to a second type of wafer, the link processing system may perform a sequence of moves using a motion stage until the system reaches a predetermined thermal equilibrium threshold.

As used herein: the term "on" means not just directly on but atop, above, over, or covering, in any way, partially or fully. Also the term "substantially" is a broadening term that means about or approximately but does not imply a high degree of closeness.

Reference is now made to the figures in which like reference numerals refer to like elements. For clarity, the first digit of a reference numeral indicates the figure number in which the corresponding element is first used. In the following description, numerous specific details are provided for a thorough understanding of the embodiments disclosed herein. However, those skilled in the art will recognize that the embodiments can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

I. Recipe Dependent Processing Parameters

Figure 4:
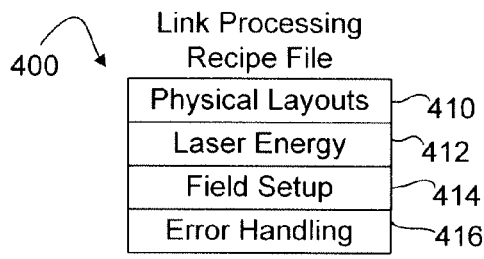
FIG. 4 is a block diagram of a data structure for a conventional link processing recipe file.

Link processing systems generally include "recipes" that describe how wafers are to be processed. However, conventional link processing recipe files do not allow users to modify the system to maximize or improve throughput with acceptable accuracy on a variety of wafer products. For example, FIG. 4 is a block diagram of a data structure for a conventional link processing recipe file 400. The conventional link processing recipe file 400 generally includes physical layout parameters 410, laser energy parameters 412, field setup parameters 414, and error handling parameters 416.

The physical layout parameters 410 may specify physical dimensions of a wafer such as die size and locations of alignment targets. The laser energy parameters 412 may specify a first laser energy to use for scanning alignment targets and a second laser energy to use for processing links. The field setup parameters 414 may specify targets, target timeouts, and respective target shapes in alignment fields, focus fields, and processing fields. Alignment fields include calibration data for XY direction alignment of the laser to the workpiece. Focus fields include calibration data for Z direction alignment of the laser to the workpiece. Processing fields, which are typically much larger than alignment fields, define the field sizes for processing link runs. For example, a 300 mm wafer may be processed using four to six processing fields. However, one to three processing fields or more than six processing fields may also be used. A link run, which may be as long as the X or Y dimension of the alignment field, may span multiple alignment/focus fields. The error handling parameters 416 may specify, for example, recovery mechanisms when poor quality scans are detected and "target timeout times" that specify a maximum duration for which the system will use data gathered during an alignment scan (sometimes referred to herein as a beam-to-work (BTW) scan). The error handling parameters 416 may also include, for example, target scan positioning tolerances.

Figure 5:
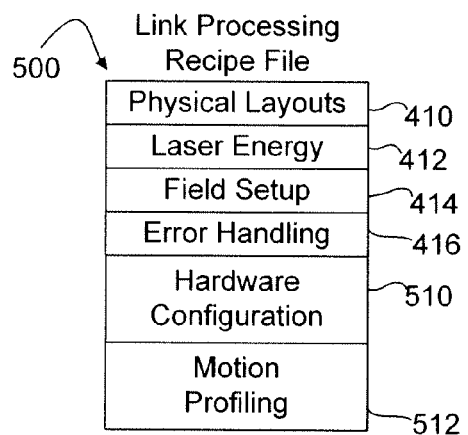
FIG. 5 is a block diagram of a data structure for a link processing recipe file according to one embodiment.

In one embodiment disclosed herein, a link processing system that includes a processor allows users to selectively specify additional parameters in order to optimize or improve throughput for a selected wafer. For example, FIG. 5 is a block diagram of a data structure for a link processing recipe file 500 according to one embodiment. The link processing recipe file 500 includes the physical layout parameters 410, laser energy parameters 412, field setup parameters 414, and error handling parameters 416 discussed above. However, the link processing recipe file 500 also includes hardware configuration parameters 510 and motion profiling parameters 512 that users may selectively specify to optimize or improve the link processing system.

Figure 6:
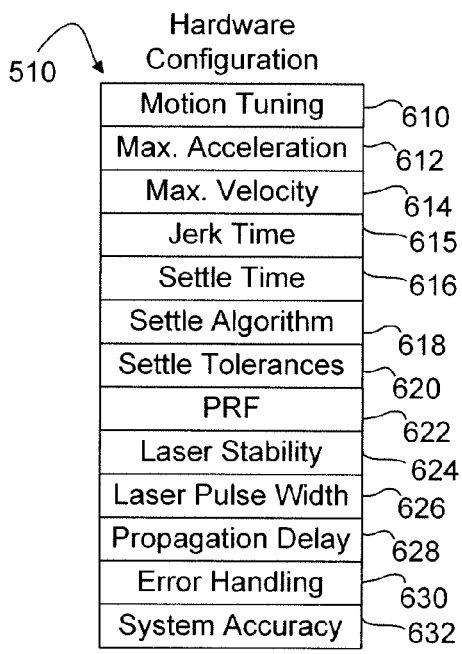
FIG. 6 is a block diagram of a data structure for hardware configuration parameters shown in FIG. 5 according to one embodiment.

FIG. 6 is a block diagram of a data structure for the hardware configuration parameters 510 shown in FIG. 5 according to one embodiment. As shown, the hardware configuration parameters 510 may include, for example, motion tuning 610, maximum acceleration 612, maximum velocity 614, jerk time 615, settle time 616, settle algorithm 618, settle tolerances 620, pulse repetition frequency (PRF) 622, laser stability 624, laser pulse width 626, propagation delay 628 (or delay distances at a processing velocity), error handling 630, and desired system accuracy 632.

The motion tuning parameters 610 may specify, for example, controller tuning values for specific actuators within the link processing system's motion stage. The maximum acceleration 612, the maximum velocity 614, and the required settle time 616 may be specified for each axis (e.g., an X-axis and a Y-axis) of the motion stage. The settle algorithm 618 may include a set of instructions for causing a processor to determine whether the motion stage has settled after a particular move along a particular axis. The settlement algorithm 618 may also include a set of instructions for determining whether the stage is sufficiently settled at a constant velocity after the velocity of a particular axis has been changed. In another embodiment, the settle algorithm 618 may be embodied in hardware logic. The settle tolerances 620 may specify tolerable position and velocity errors that the motion stage satisfies after a particular move before the settle algorithm 618 determines that the move is settled.

The error handling parameters 630 may specify, for example, hardware error detection parameters, error tolerances, monitoring configurations, and interlocking parameters (e.g., error conditions under which further link processing is stopped). For example, a wafer that is able tolerate relatively large cross-axis errors may include a recipe configuration allowing larger error tolerances before errors are triggered and processing is halted.

Figure 7:
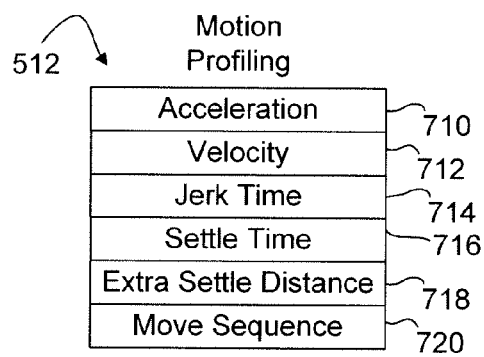
FIG. 7 is a block diagram of a data structure for motion profiling parameters shown in FIG. 5 according to one embodiment.

FIG. 7 is a block diagram of a data structure for the motion profiling parameters 512 shown in FIG. 5 according to one embodiment. As shown, the motion profiling parameters 512 may include, for example, an acceleration 710, a velocity 712, a jerk time 714, a settle time 716, an extra settle distance 718, and a move sequence 720.

Figure 8:
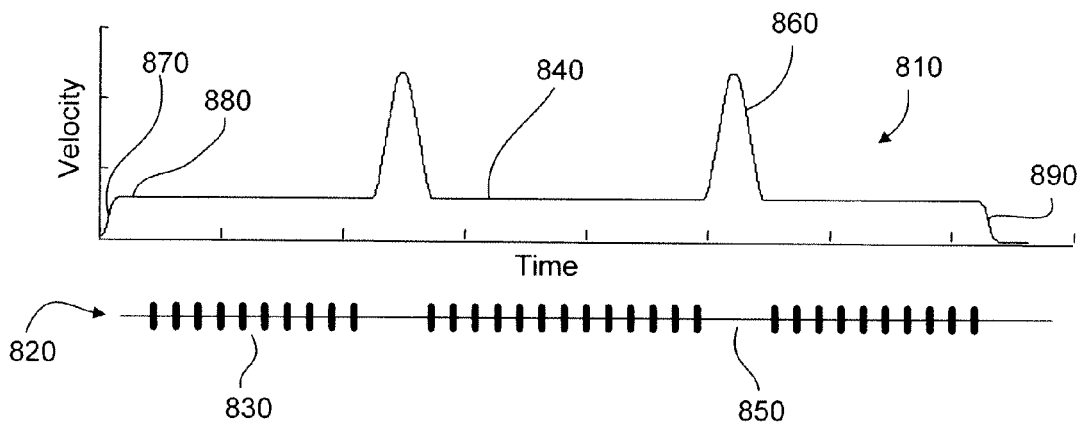
FIG. 8 is a schematic diagram illustrating a link run velocity profile corresponding to the processing of a link run according to one embodiment.

For a better understanding of the motion profiling parameters 512, reference is now made to FIG. 8, which illustrates a link run velocity profile 810 corresponding to the processing of a link run 820 according to one embodiment. As used herein, the term "velocity profile" means velocity as a function of time or distance over a span of time or an interval of distance. Link run execution includes of a number of different operations. While processing a bank 830 of links with a tight pitch spacing (e.g., the center-to-center distance between adjacent links in the same bank), the laser beam axis advances relative to the wafer at a nearly constant velocity 840. Note that, although FIG. 8 shows an example in which the constant velocity 840 is the same for each link bank 830 in the link run 820, it is possible that different link banks 830 may have different constant velocities, such as when the pitch spacing differs from bank to bank in the same link run.

When there is a large gap 850 between subsequent links in a link run, the system accelerates to span the gap 850 in less time and then decelerates near the end of the gap to reach a nominal velocity once again. The acceleration and deceleration results in a gap profile 860 in the link velocity profile 810. At the beginning of a link run, the system undergoes an initial acceleration 870 from a resting position followed by a period of settling 880. At the end of a link run, the system undergoes a deceleration 890 back down to zero velocity. Thus, the typical operations that the system performs during execution of a link run include ramping up the stage to constant velocity, settling, processing links at constant velocity, accelerating (gap profiling) over any large gaps, and ramping back down to zero velocity at the end of the run. FIG. 8 illustrates the effect of these operations on link run on-axis velocity. Note that while the link run 820 is depicted as a straight line through collinear link banks, it is possible for the banks of links to not be in line. The link run 820 would then include lateral position commands as well.

A gap profiling operation involves accelerating, decelerating, and settling to travel between two links in less time than would be required at constant velocity. The increased throughput provided by gap profiling is dependent upon the quantity and spacing of large gaps between links, the acceleration capabilities of the stage, the settle time, and the link run velocity. A greater time savings results on products that have many large gaps in link runs and a small link pitch.

Generally, the time spent accelerating and decelerating at the start and end of link runs is approximately 1.5% of the time spent on link runs. The time saved with gap profiling is approximately 50% of the time that would be required to traverse the link runs at constant velocity. These numbers vary widely for different types of wafers. Wafers with few or no large gaps between links may not receive any benefit from gap profiling. On the other hand, products with sparse or random link layout may receive greater benefit from gap profiling.

Thus, returning to FIG. 7, the motion profiling parameters 512 may be selectively specified for general moves, BTW scans, link runs, gaps, or a combination of the foregoing. The motion profiling parameters 512 may also be selectively specified for ramping up and ramping down. The move sequences 720 may also be selectively specified in the link processing recipe file 500.

An artisan will recognize from the disclosure herein that the parameters shown in FIGS. 5-7 are provided by way of example only, and not by limitation. Indeed, many other parameters may also be controlled or configured in the link processing recipe file 500 for particular wafers or types of wafers. An artisan will further understand that this disclosure is not limited to specifying the parameters in the link processing recipe file 500. For example, the parameters may be specified in a database, a parameter file, a source code, a set of computer executable instructions stored on a computer readable medium, or in any of a variety of other ways of configuring system properties.

II. Automatic System Adaptation

As discussed above, in one embodiment, a user may directly specify one or more parameters in the link processing recipe file 500. The link processing system may then process one or more wafers using the specified parameters. In addition, or in another embodiment, the link processing system automatically adjusts (e.g., using the processor) hardware configuration parameters, profiling parameters, process field setup, alignment target setup, motion preheating, combinations of the foregoing, and other system parameters. The automatically configured parameters may be specified in the link processing recipe file 500 or in another system setting, as discussed above.

In one embodiment, the link processing system selects a set of parameters to use based on different system states, system configurations, system properties, system parameters, processing history, product processing history, motion profiling history, and/or parameters specified in recipe files. For example, the link processing system may select a set of system parameters based on measured temperatures, thermal drift rates, environmental conditions, and/or other parameters.

In addition, or in another embodiment, the link processing system may configure itself based on user-specified recipes so as to maximize or improve throughput while satisfying desired processing parameters such as accuracy, laser stability, and laser pulse width.

In addition, or in another embodiment, the link processing system may automatically adapt system parameters such as motion profiles, process field setup, and optical spot properties. Such adaptation may involve, for example, correlating parameter settings, properties, and results. The correlated results may include, for example, measured dynamic errors, drift rates, drift magnitudes, post processing yields, and/or post processing product damage analysis. The correlated properties may include, for example, statistical metrics of system error (e.g., motion stage errors such as cross-axis, on-axis, and/or fast steering mirror (FSM) errors) and prior knowledge of wafer properties, and/or wafer property variations (e.g., layer thicknesses or measured reflectivity). The correlated parameters may include, for example, motion profiles, settle times, process field shape and size, and laser pulse properties.

In addition, or in another embodiment, the link processing system may adaptively or automatically configure some or all wafer setup parameters, including setup parameters that are typically configured manually in conventional link processing recipe files, based on correlations of parameter settings, properties, wafer product yield, and/or processing results. After performing such an adaptive setup, in one embodiment, the link processing system (or a user) may then decide to discontinue the adaptations during regular wafer processing.

In one embodiment, automatic system adaptation (whether for setup or regular processing) may use rule based decisions or parameters, modeling, prediction, characterizations of the system or system component behavior (e.g., laser and/or mechanical components), wafer properties, accuracy budgeting, artificial intelligence, fuzzy logic, neural networks, cost function minimization, or other algorithmic implementation or methodology for changing system parameters and system behavior for achieving desired process results.

In addition, or in another embodiment, the link processing system accurately records (e.g., in a log file) changes made by the system and/or a user for troubleshooting of system errors, documentation, statistical analysis, and process control. Recording such data may be useful, for example, when the link processing system has the ability to adapt and automatically make processing changes. The link processing system captures and logs data that characterizes how the system processed the wafers. The data may include, for example, the processing parameters, configurations, hardware configurations, control parameters, motion profile parameters, processing decisions, adaptations, system behavior, system movement, system preconditioning, sensor measurements, controller variables or states, error conditions, and any other data necessary to understand how the processing proceeded. The data may include raw data and/or statistical metrics derived from the data. In one embodiment, the link processing system is also configured to reproduce or replay the recorded behavior on other systems for testing and troubleshooting.

Figure 9:
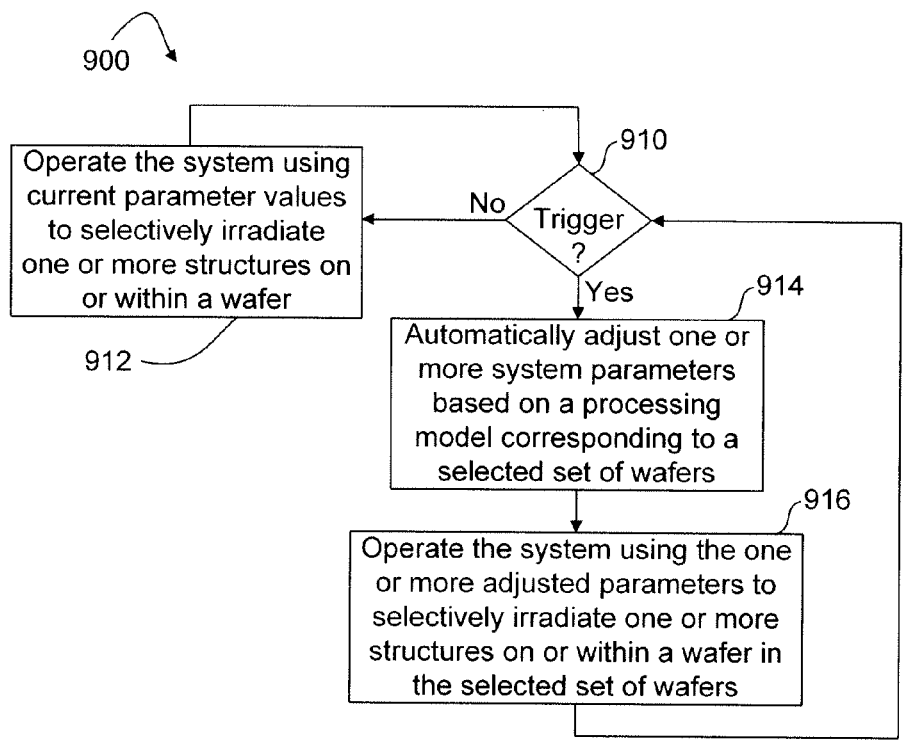
FIG. 9 is a flowchart illustrating a process for automatically modifying a link processing system according to one embodiment.

FIG. 9 is a flowchart illustrating a process 900 for automatically modifying a link processing system according to one embodiment. The process 900 includes determining 910 whether a trigger has occurred that is associated with a processing model for a link processing system. The processing model may correspond to a selected set of wafers (e.g., corresponding to a particular type of IC or other product). In one embodiment, the processing model is based on a tradeoff analysis between a throughput of the link processing system and an accuracy of the link processing system.

The trigger may include, for example, a detected system state, a wafer product yield, a measured processing result, a user-modification to a hardware configuration parameter, a user-modification to a motion profiling parameter, and/or a change to wafer fabrication data. The trigger may also include, for example, a change in wafer product or type.

If the link processing system does not detect a trigger, the process 900 includes operating 912 the link processing system using current (e.g., unmodified) parameter values to selectively irradiate one or more structures on or within a wafer. When the link processing system detects a trigger, the process 900 includes automatically adjusting 914 one or more system parameters based on a processing model corresponding to a selected set of wafers. The process 900 also includes operating 916 the link processing system using the one or more adjusted parameters to selectively irradiate one or more structures on or within a wafer in the selected set of wafers.

Various example embodiments are provided below for configuring and/or adapting processing parameters, system parameters, alignment parameters, hardware configuration parameters, motion profiling parameters, processing pulse parameters, and other parameters based upon variations in wafer product type, location dependent system variations, wafer variations, system state variations, system history variations, ambient environmental variations, product yield variations, link blow quality variations, and variations in the results of product processing.

III. Example Responses to a Preheating Trigger

A. Motion Preheating

Figure 10:
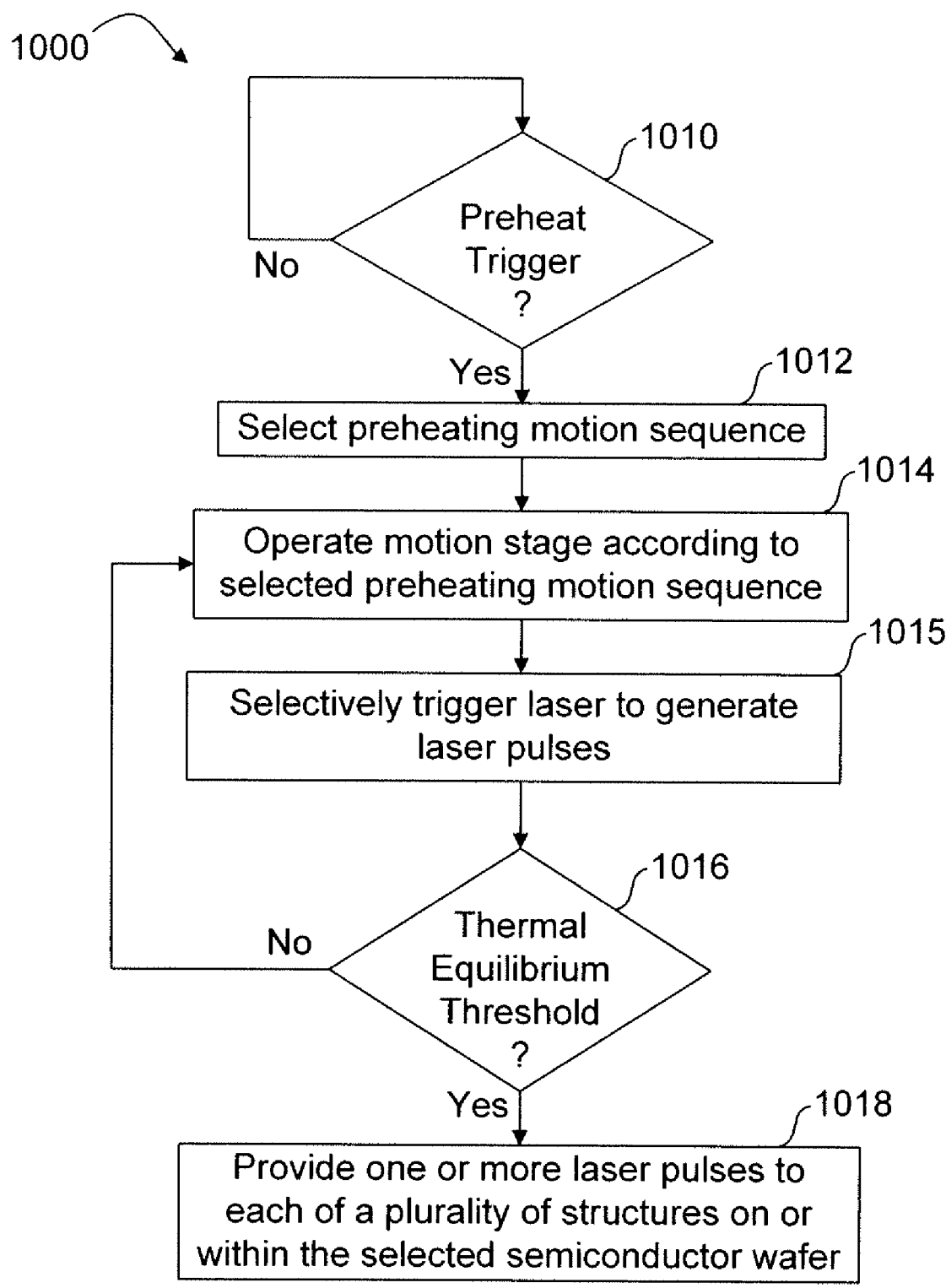
FIG. 10 is a flow chart illustrating an example process for preheating a motion stage by simulating link runs according to one embodiment.

FIG. 10 is a flow chart illustrating an example process 1000 for preheating a motion stage by simulating link runs according to one embodiment. The process 1000 includes detecting 1010 a preheat trigger. The preheat trigger may include, for example, variations in a thermal state related to the motion stage. Thus, in one embodiment, detecting 1010 the preheat trigger includes measuring thermal drift in a link processing system. When processing wafers after a system has been idle for a period of time, a comparatively large rate of thermal drift occurs within approximately 20 minutes to approximately 40 minutes after starting to process a new lot of wafers. When presenting a new lot of wafers to an idle system, the first several wafers in the lot may be processed while drift rates are higher. After a thermal equilibrium threshold is reached, drift rates stabilize and the link processing system provides increased accuracy. However, the first several wafers processed in the lot after the system has been idle may have decreased accuracy or yield.

In one embodiment, the preheat trigger is based on a processing history of the link processing system. For example, the link processing system may generate the preheat trigger after being idle for a predetermined period of time prior to processing a wafer. In addition, or in another embodiment, the preheat trigger may be based on a particular wafer or type of wafer selected to be processed by the link processing system. For example, the link processing system may generate the preheat trigger when switching from a first wafer product type to a second wafer product type. Processing the first wafer product type may cause the motion stage to reach a different steady state thermal equilibrium than that reached when processing the second wafer product type. Thus, a first processing model may be associated with the first wafer product type and a second processing model may be associated with the second wafer product type.

By way of example, the link processing system may generate the preheat trigger under a number of different scenarios including, without limitation: when the system has completed processing all wafers in a lot and is waiting to receive new lots of wafers; when the system has been off and is being warmed up prior to any processing; and when the system has been processing one wafer product and is being switched to a different wafer product.

In this example embodiment, undesirable thermal drift is minimized or reduced using motion stage movement to preheat the link processing system. By subjecting the motion stage to some "idle motion" (e.g., without irradiating structures on or within a wafer), a thermal equilibrium or a state much closer to the actual operating thermal equilibrium may be reached.

Thus, the process 1000 further includes selecting 1012 a preheating motion sequence that appropriately heats the actuators in the motion stage. In one embodiment, the selected preheating motion sequence includes a sequence of moves corresponding to the sequence expected to process a next wafer. This may be the actual move sequence or an abbreviated/modified version. In another embodiment, the selected preheating motion sequence includes a sequence of moves used for the last or most recently processed wafer. This may be the actual move sequence or an abbreviated/modified version. In another embodiment, the selected preheating motion sequence includes a standard or predetermined sequence of moves. A standard sequence of moves may also be determined for a specific type of wafer product or recipe.

In another embodiment, the selected preheating motion sequence is selected to induce specific changes in the thermal state of the system. For example, if the first wafer product type in our example makes little or no use of actuators corresponding to the Y-axis and heavy use of actuators corresponding to the X-axis, and the second wafer product type makes heavy use of the actuators corresponding to the Y-axis and little or no use of the actuators corresponding to the X-axis, then the selected preheating motion sequence (e.g., when switching from the first wafer product type to the second wafer product type) may be configured to heat the actuators corresponding to the Y-axis and to let the actuators corresponding to the X-axis cool.

The process 1000 further includes operating 1014 the motion stage according to the selected preheating motion sequence. The selected preheating motion sequence may be initiated immediately after detecting the preheat trigger, after a delay period to allow one or more wafers in a current lot to be processed, and/or before processing a next wafer in a current wafer lot or a next wafer lot.

In one embodiment, the process 1000 includes selectively triggering 1015 the laser to generate pulses. These pulses may be delivered through the train of optics, selectively blocked, or blocked from reaching the workpiece. In embodiments where the pulses are not blocked, they may be delivered with a defocused spot or delivered when there is no wafer on the chuck. Generating pulses during the preheating cycle thermally stabilizes the laser and any associated pulse switching hardware prior to processing. Thus, thermal drift associated with the laser beam and the beam path may be reduced.

The process 1000 further includes determining 1016 whether the idle motion has adjusted the thermal state of the link processing system to be within a predetermined thermal equilibrium threshold. The predetermined thermal equilibrium threshold represents an acceptable range of variations in the system's thermal state. Once the system's thermal state is within the predetermined thermal equilibrium threshold, the process 1000 includes operating 1018 the link processing system so as to maintain the predetermined thermal equilibrium threshold while selectively irradiating structures on or within a wafer.

Determining whether to initiate motion preheating, selecting the specific preheating sequence, selecting the duration of the preheating, and/or determining that motion preheating is complete may be based on, without limitation: a measured or predicted thermal state of the link processing system or a comparison of this thermal state with a desired thermal state; a length of time the system has been idle or an elapsed time since the system was initialized; a type of wafer product previously processed and/or expected to be processed next; a sequences of specific moves (measured and/or predicted) previously processed and/or expected to be processed next; a history, prediction, and/or statistical analysis of move commands, duty cycles, current commands, voltage commands, and/or other parameters relevant to stage motion or system thermal state; measurements of thermal drift, including measurements based on sensors (e.g., position and/or temperature), to measure mechanical system components, measurements based on direct measurements of alignment targets, reference targets, wafers, accuracy wafers, or other metrology structures using the system's processing laser, a metrology laser, or other alignment sensors such as cameras; and/or one or more parameters such as desired system accuracy, allowable thermal drift for a selected wafer product, wafer product processing margins (e.g., on-axis, cross-axis, and/or focus margin), system error budget, and/or characterizations of component drift.

Algorithms for determining whether to initiate motion preheating, selecting the specific preheating sequence, selecting the duration of the preheating, and/or determining that motion preheating is complete, based on the above factors, may be implemented, for example, as rule based cases that may minimize or reduce cost functions. The algorithms may use, for example, artificial intelligence, fuzzy logic, neural networks, learning control, and/or adaptive algorithms.

In another embodiment, the application of motion preheating is not automatic. In such an embodiment, initiating or terminating preheating and selecting preheating move sequences may be done manually. Motion preheating may also be performed based on manually configured rules or recipe parameters.

B. Processing Field Adjustment

Figure 11:
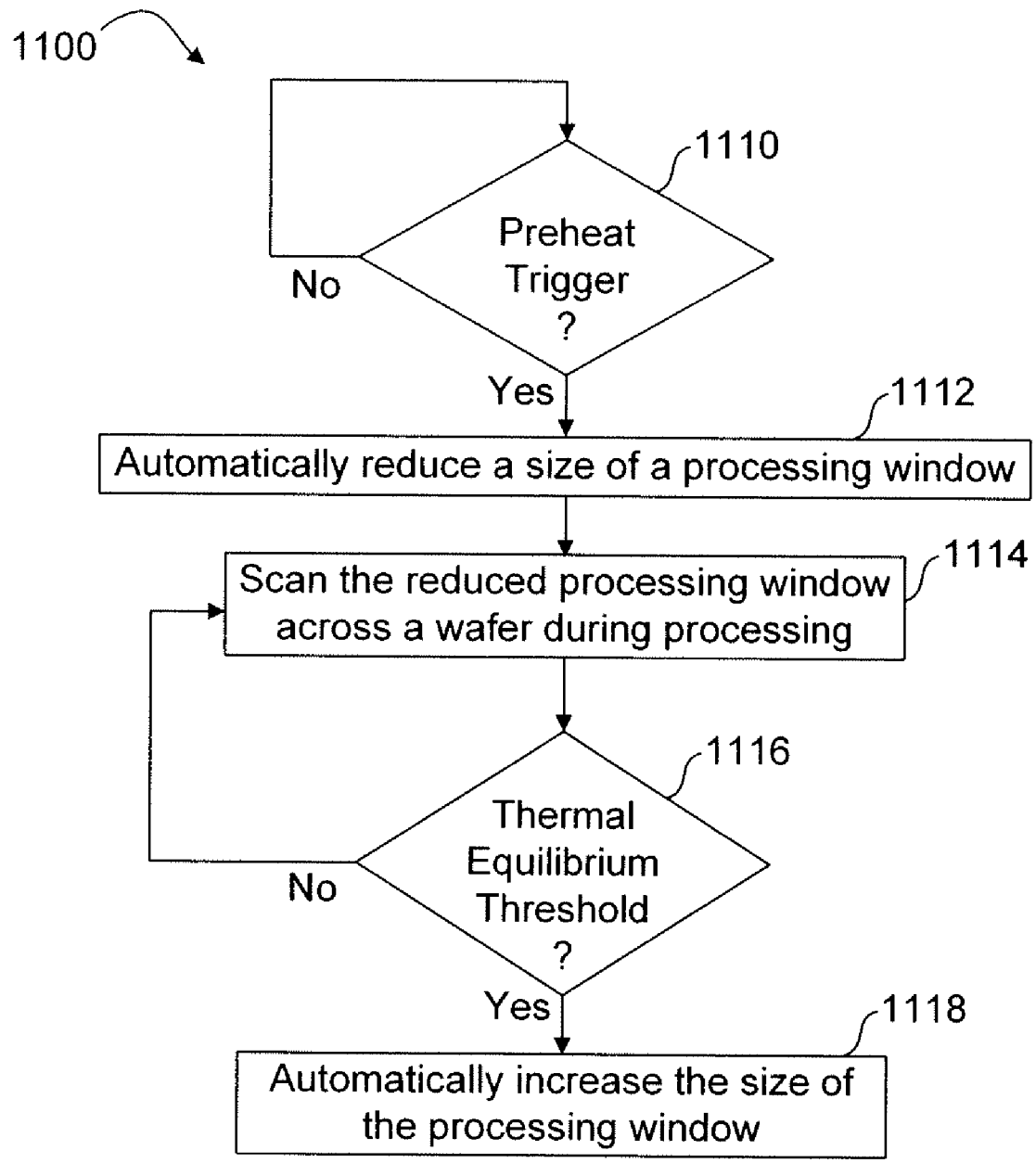
FIG. 11 is a flow chart illustrating an example process for adjusting a processing field according to one embodiment.

FIG. 11 is a flow chart illustrating an example process 1100 for adjusting a processing field according to one embodiment. The process 1100 includes detecting 1110 the preheat trigger as discussed above with respect to FIG. 10. When the preheat trigger is detected, the process 1100 also includes automatically reducing 1112 a size of a processing field and scanning 1114 the reduced processing field across a wafer during processing. The process 1100 further includes determining 1116 whether the link processing system has reached a predetermined thermal equilibrium threshold, as discussed above. Once the thermal equilibrium threshold is reached, the process 1100 includes automatically increasing 1118 the size of the processing field.

Generally, link processing systems provide a relatively high throughput when using a single processing field (SPF) or a small number of large processing fields. However, using large processing fields tends to reduce accuracy due to increased time ("target age") between alignment target scans. Target age coupled with thermal drift may degrade accuracy.

After a link processing system has been idle for a period of time, for example, the link processing system may be in a transient thermal state that decreases accuracy. To improve accuracy, the link processing system may use a smaller processing field to process the first three or four wafers. However, the smaller processing field may reduce the system's throughput. Thus, once the link processing system reaches the predetermined thermal equilibrium threshold, it increases the size of the processing field to speed up the processing of subsequent wafers.

IV. Example Adaptations Based on Location Dependent Processing Parameters

Link processing systems typically have different performance characteristics when motion stages are in different locations with respect to a wafer. Processing parameters that may vary as a function of location include, for example, bandwidth, response time, dynamics, resonant characteristics, and response characteristics. These properties may impact system throughput and accuracy. Thus, using a single set of processing parameters when a motion stage is in different positions may reduce overall system performance.

In one embodiment, a link processing system automatically adapts to location dependent processing parameters by statistically analyzing processing metrics (e.g., stage tracking errors, throughput, settle times, bandwidth, resonant frequencies, post-processing yield, and link blow quality). The link processing system then modifies system parameters to optimize or improve processing. Such an optimization may involve maximizing throughput while maintaining accuracy. In addition, or in another embodiment, the optimization may involve minimizing a cost function that penalizes processing time and degraded accuracy.

Example parameters that may be optimized or improved as a function of location include stage tuning parameters, motion profiling parameters (e.g., jerk time, acceleration, settle time, peak velocity, and gap profiling parameters), process parameters, alignment parameters, focus field parameters (e.g., shape, size, target locations, number of targets to use, target timeout, target models, and position geometry correction (PGC) models), laser parameters (e.g., pulse energy, spot size, and pulse shape), and any other processing parameter. PGC models map link coordinates inside a focus or alignment field. In one embodiment, the model has a format: $Xsys=C0+C1*Xcad+C2*Ycad+C3*Xcad*Ycad$, where $C0 \ldots C3$ are parameters determined from curve fits during alignment field scanning, Xcad and Ycad are respective computer aided design (CAD) coordinates of the links to be processed, and Xsys is the X position in the system coordinates (interferometer) used to process a link. Similar mapping may be performed for Y and Z dimensions. Of course, an artisan will recognize from the disclosure herein that higher-order models, lower-order models, or different models may be used to map link coordinates within focus or alignment fields.

System command parameters may also be optimized or improved as a function of location. Such system command parameters may include, for example, ordering of system operations, both temporally and spatially. For example, different chuck regions may have different target timeouts and/or may require different intermixing of link runs and target scans.

In an example embodiment, the link processing system measures motion stage errors (e.g., cross-axis, on-axis, FSM, and/or TLC) as a function of time after acceleration. The required or desired settle time to meet predetermined system accuracy may vary as a function of the motion stage's X and Y locations. Thus, after measuring the motion stage errors, the link processing system determines a set of minimum settle times that ensures accuracy for various motion stage locations. The link processing system then uses the set of location-dependent settle times to profile and sequence link runs and gap profiling events. Because the link processing system does not use a single settle time at every location, throughput is enhanced while maintaining accuracy.

V. Example Adaptations Based on System State

As discussed above, thermal drift may be relatively large when the link processing system is in a transient condition such as when switching from an idle state to a wafer processing state. Thermal drift may also be large, for example, when the link processing system is switching between processing a first wafer product type and a second wafer product type. Conventional link processing systems generally implement processing field shapes and sizes that ensure accuracy during transient states. However, these fields are typically smaller than is required once thermal stability has been achieved. Thus, processing speeds and overall throughput are decreased.

In one embodiment, a link processing system automatically determines processing fields and processing operations by taking into account system parameters, system operation, system operational history, system internal environment, and system external environment. The link processing system then optimizes or improves product processing to maximize or increase throughput while maintaining acceptable accuracy. In one such embodiment, the link processing system automatically selects appropriate processing parameters during warm up and steady-state processing that ensure accuracy and maximum throughput.

Example factors that the link processing system may consider in determining how to process wafers include, but are not limited to: the number of X and Y axis link runs; the number of links included in the link runs; the statistical distribution of gaps between links over which gap profiling is performed; the predicted or measured time for the X axis link runs, Y axis link runs, and/or total processing time; previously determined system target timeout times or knowledge of the time-scale over which the system loses accuracy; predicted or measured heat generation in actuators, lasers, optical components such as an acousto-optic deflector (AOD), and other system components; and measured temperature distribution in the actuators, chuck, air-bearing stage, lasers, AODs and/or other optical components, optical mounts, system air temperature, or other system components.

The link processing system may also take into account the drift of accuracy targets. For example, the link processing system may predict the drift of accuracy targets, measure the drift of accuracy targets in real-time, and/or ascertain the drift of accuracy targets from a history of similar wafers. In addition, or in another embodiment, the link processing system may determine whether or not the system has achieved thermal steady state. For example, the link processing system may make measurements related to its thermal state and/or determine whether it has reached a thermal steady state from a history of recently processed wafers.

Other factors that the link processing system may consider in determining how to process wafers include, for example: user-selected error tolerances (e.g., on-axis, cross-axis, and/or focus height error); cost functions for analyzing a tradeoff between error and throughput; historical data gathered from post-processing yield analysis; and conditions of the operating environment such as external temperature, temperature history, and/or measured/typical vibrations of the fabrication floor.

Properties of specific link processing systems (which may be static or may vary) may be measured or user-specified, and may be used to optimize processing parameters. Examples of such properties may include measured stage cross-axis error as a function of time or laser pulse width. Another example property includes energy as a function of PRF.

After determining or measuring the system state properties and information discussed above, the link processing system may determine wafer processing parameters such as: the size, shape, and number of processing fields, alignment fields, and focus fields; the location and number of targets that require scanning in the alignment and focus fields; the target timeout time; the time at which to scan or rescan alignment targets, and/or the time/position at which to scan new alignment targets; the model and algorithms used to map link coordinates into coordinates for processing; the order in which link runs are to be processed, which may include intermixing of X and Y link runs; the optimal or desired grouping or breaking of link runs within process fields to maximize or increase throughput; the combination of link runs with the same or different cross-axis link coordinates; the proper or desired setting of the hardware configuration parameters 510 and the motion profiling parameters 512 discussed above with respect to FIGS. 5-7; and the system preconditioning, preheating time, or motion preheating time or movement pattern discussed above. Thus, a user and/or the link processing system may maximize or improve throughput while maintaining acceptable system error.

VI. Example Adaptations Based on Wafer Properties

In some embodiments, a link processing system automatically adapts system and/or processing parameters based on known wafer properties. Such wafer properties may include fabrication options, fabrication errors, variances within fabrication tolerances, and/or other deviations between wafers or wafer lots. Wafer properties that may trigger automatic adaptation may include, for example, passivation thickness, layer thickness, and materials used. Other properties include link or alignment target stacks, structures, and layouts. The wafer properties may vary from wafer to wafer or in different locations or regions of an individual wafer.

Prior knowledge of wafer properties may be obtained from measurements made prior to link processing or from fabrication data or log files. Knowledge of wafer properties may also be gained by system measurement of the properties.

Based on the wafer properties, the link processing system adapts system and/or processing parameters to improve yield, accuracy, throughput, and/or other desirable processing properties. For example, the link processing system may automatically adjust parameters that impact the interaction of light with the wafer, the links, and/or the alignment targets. Interactions between light and links and/or alignment targets include parameters such as laser energy, pulse shape, pulse width, spot size, and/or other optical properties. The link processing system may also adjust additional BTW scan properties such as the scan model for correlation/peak finding or the algorithms used to determine the scan locations. In certain embodiments, wafer dependent properties may influence the use of certain sensors, such as cameras for vision target alignment.

An artisan will recognize that the systems and methods described herein may be applicable to link processing, trimming, drilling, routing, via drilling, scribing, marking, singulating, dicing, component trimming/tuning, and other material alternation processes, either performed with lasers, drills, other cutting tools, and/or directed energy techniques such as using a focused ion beam (FIB). Further, the systems and methods described herein may be useful for other devices besides processing tools. For example, the systems and methods described herein may be useful for metrology tools such as electron microscopes.

It will be obvious to those having skill in the art that many changes may be made to the details of the above-described embodiments without departing from the underlying principles of the invention. The scope of the present invention should, therefore, be determined only by the following claims.

What is claimed is:

1. A method for preheating a laser-based system for processing target specimens, the method comprising:
   detecting variations in a thermal state; and
   in response to the variations, preheating the laser-based system before laser processing structures on or within a target specimen, wherein the preheating generates heat to reduce the detected variations in the thermal state, and wherein the preheating comprises:
   selecting a preheating motion sequence; and
   operating a motion stage in a sequence of moves according to the selected preheating motion sequence without irradiating any of the structures on or within the target specimen.

2. The method of claim 1, further comprising preheating based on operating a laser source without laser processing the structures on or within the target structure, the preheating based on operating the laser source to further generate heat to reduce the detected variations in the thermal state.

3. The method of claim 2, wherein preheating based on operating the laser source comprises:
   generating a laser beam; and
   preventing the laser beam from reaching the target specimen.

4. The method of claim 2, wherein preheating based on operating the laser source comprises:
   generating a laser beam; and
   defocusing the laser beam so as to prevent processing of the structures on or within the target specimen.

5. The method of claim 1, wherein detecting variations in the thermal state comprises measuring thermal drift in the laser-based system.

6. The method of claim 1, wherein detecting variations in the thermal state comprises determining that a motion stage is idle for a predetermined period of time.

7. The method of claim 1, wherein detecting variations in the thermal state comprises receiving a command to switch from processing a first set of target specimens to processing a second set of target specimens.

8. The method of claim 7, wherein processing the first set of target specimens generates a different amount of heat than that generated by processing the second set of target specimens.

9. The method of claim 1, wherein the preheating further comprises:
   deactivating a laser; and
   while the laser is deactivated, operating the motion stage in a sequence of moves corresponding to movements used to irradiate the structures on or within the target specimen.

\* \* \* \* \*